United States Patent [19]
Davis et al.

[11] Patent Number: 5,166,641
[45] Date of Patent: Nov. 24, 1992

[54] PHASE-LOCKED LOOP WITH AUTOMATIC PHASE OFFSET CALIBRATION

[75] Inventors: Craig M. Davis; David A. Byrd, both of Puyallup, Wash.

[73] Assignee: National Semiconductor Corporation, Santa Clara, Calif.

[21] Appl. No.: 852,639

[22] Filed: Mar. 17, 1992

[51] Int. Cl.[5] .............................................. H03L 7/085
[52] U.S. Cl. ...................................... 331/1 A; 331/8; 331/14; 331/17; 331/25
[58] Field of Search ...................... 331/1 A, 8, 14, 17, 331/25

[56] References Cited

U.S. PATENT DOCUMENTS 4,814,726  3/1989  Byrd et al. .......................... 331/1 A
5,068,626 11/1991  Takagi et al. ........................ 331/17

Primary Examiner—Siegfried H. Grimm
Attorney, Agent, or Firm—Flehr, Hohbach, Test, Albritton & Herbert

[57] ABSTRACT

A phase-locked loop having automatic internal phase offset calibration includes a voltage-controlled oscillator circuit for generating a recovered data signal in response to an error signal. A phase detector determines the phase difference between the recovered data signal and a reference data signal. The phase-locked loop further includes a charge pump circuit, coupled to the phase detector, for generating an error signal in response to the detected phase difference. The charge pump circuit includes first and second pump generators for respectively providing first and second sets of pump signals, with the pump generators being interconnected to facilitate generation of the error signal. The phase-locked loop is designed to alternate between operation in phase correction and phase calibration cycles. In each phase correction cycle an error signal is synthesized as described above on the basis of the most recent phase comparison. During each intervening phase calibration cycle a calibration network operates to adjust the second charge pump generator such that the first and second sets of pump signals are precisely balanced when the reference and recovered data signals have a predefined phase relationship. In a preferred embodiment the predefined phase relationship corresponds to that of the reference and recovered data signals being matched in phase. In this way inconsistencies in the operating characteristics of the pump generators are precluded from engendering steady-state phase alignment errors between the reference and recovered waveforms.

13 Claims, 3 Drawing Sheets

PHASE-LOCKED LOOP WITH AUTOMATIC PHASE OFFSET CALIBRATION

The present invention relates generally to phase-locked loops, and particularly to methods and systems for reducing internal phase alignment errors.

BACKGROUND OF THE INVENTION

Referring to FIG. 1, a digital phase locked loop (PLL) produces recovered data or clock signals related in frequency to an input reference signal. A digital phase comparator is generally utilized in conjunction with a charge pump circuit to provide a pulsed error signal indicative of the phase difference between the reference signal and a recovered signal. The charge supplied by the error signal is used to develop a control voltage across a capacitor included within a loop filter. A voltage-controlled oscillator (VCO) operates to vary the frequency of the recovered signal in accordance with the control voltage.

Since the control voltage is required to be both increased and decreased during operation of the VCO, the charge pump circuit typically includes pump up and pump down current generators for supplying positive and negative current pulses, respectively, to the loop filter capacitor. A positive current pulse is synthesized by energizing the pump up generator for an interval longer than that over which the pump down generator is actuated, while a negative pulse is created in the opposite manner. Hence, if the pump up and pump down generators have equivalent magnitudes and rise times a net current of zero will be delivered by the charge pump to the loop filter when the pump generators are contemporaneously activated for identical time intervals.

Unfortunately, the pump up and pump down current generators used in charge pump circuits often have different rise times and/or current magnitudes. For instance, on-chip processing variations may cause the devices within pump circuits of similar architecture to differ in magnitude. Consequently, the net current provided to the loop filter will be zero when the pump up and pump down generators are activated by the phase detector for pulse periods of unequal duration. Since the phase detector actuates one pump generator longer than the other upon determining the phase of the reference and recovered waveforms to be out of alignment, the PLL will become stabilized (i.e. will produce zero charge pump current) with the reference and recovered signals out of phase. Even under the condition of precise frequency lock steady-state phase errors as small as two three nanoseconds can lead to sampling discrepancies at relatively low (e.g. 20 MHz) clock rates.

It is therefore an object of the present invention to provide a phase-locked loop with precisely matched charge pump generators such that subnanosecond phase accuracy may be achieved.

SUMMARY OF THE INVENTION

In summary, the present invention is a phase-locked loop having automatic internal phase offset calibration. The inventive phase-locked loop includes a voltage-controlled oscillator circuit for generating a recovered data signal in response to an error signal. A phase detector determines the phase difference between the recovered data signal and a reference data signal. The phase-locked loop of the present invention further includes a charge pump circuit, coupled to the phase detector, for generating an error signal in response to the detected phase difference. The charge pump circuit includes first and second pump generators for respectively providing first and second sets of pump signals, with the pump generators preferably being interconnected to facilitate generation of the error signal.

The inventive phase-locked loop is designed to alternate between operation in phase correction and in phase calibration cycles. As described above, each phase correction cycle produces an error signal on the basis of the most recent phase comparison. During each intervening calibration cycle a calibration network operates to adjust the second charge pump generator such that the first and second sets of pump signals are precisely balanced when the reference and recovered data signals have a predefined phase relationship. In a preferred embodiment the predefined phase relationship corresponds to that of the reference and recovered data signals being matched in phase. In this way incosistencies in the operating characteristics of the pump generators are precluded from engendering steady-state phase alignment errors between the reference and recovered waveforms.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 2:
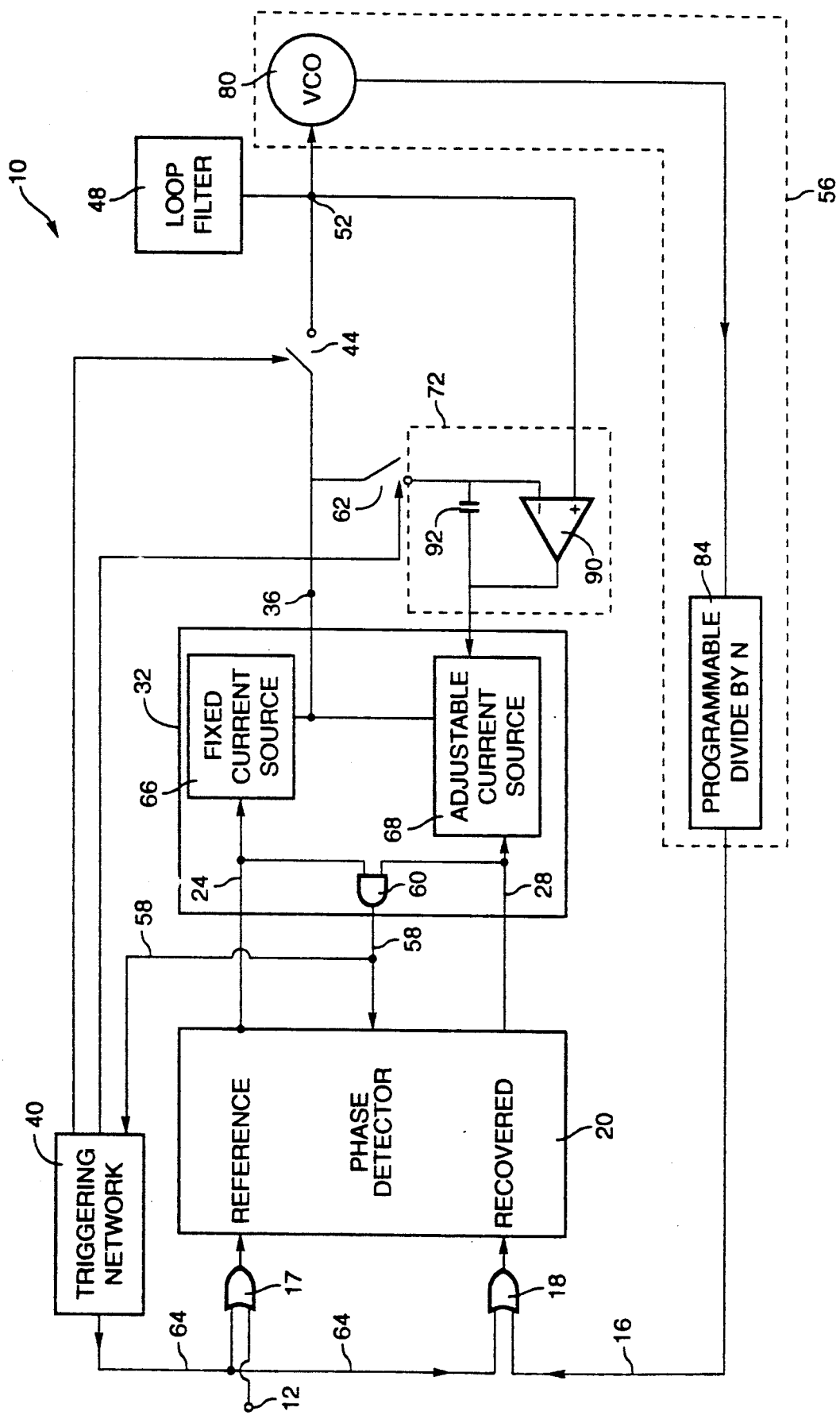
FIG. 2 is a block diagram of a preferred embodiment of the inventive phase-locked loop with automatic internal phase offset calibration.

Referring to FIG. 2, there is shown a block diagram of a preferred embodiment of the phase-locked loop (PLL) with automatic internal phase offset calibration 10 of the present invention. The inventive internally-calibrated PLL 10 includes an input terminal 12 on which is impressed a periodic reference signal. The reference signal and a recovered signal present on a first feedback line 16 respectively address first and second input OR gates 17 and 18. The relative phase of the reference and recovered signals is compared by a conventional digital phase detector 20 coupled to the first and second input OR gates 17 and 18. Upon detecting a phase difference between the compared signals the detector 20 actuates pump up line 24 and pump down line 28 in order to direct a charge pump circuit 32 to source or sink current at pump node 36.

As is described hereinafter, the PLL 10 of the present invention is designed to alternate between operation in phase correction and phase calibration modes. When the PLL 10 is engaged in the phase correction mode a triggering network 40 closes a first switch 44 so as to couple a low pass loop filter 48 to pump node 36. The low pass loop filter 48 provides a VCO control voltage at control node 52 which varies in accordance with the current produced by the charge pump circuit 32. The VCO control voltage governs the frequency of the recovered signal impressed by a VCO circuit 56 on the first feedback line 16.

As was discussed in the Background of the Invention, steady-state phase errors are prone to develop within conventional phase-locked loops as a consequence of differences in the operating characteristics of the complementary current generators included within the charge pump circuit. It is an object of the present invention to substantially eliminate such erroneous phase alignment by performing a calibration cycle between each evaluation of the relative phase difference existing between the reference and recovered signals. Specifically, the triggering network 40 is disposed to initiate a calibration cycle upon being informed of the conclusion of the preceding phase correction cycle by a second feedback line 58.

As shown in FIG. 2, the second feedback line 58 is driven by a first feedback AND gate 60 having input terminals connected to the pump up and pump down lines 24 and 28. The triggering network 40 commences the calibration cycle by opening the first switch 44 and closing a second switch 62. Triggering network 40 next raises calibration line 64 for the duration of a calibration interval. The phase detector 20 responds as though it has received reference and recovered signals perfectly in phase by generating identical pulse signals on lines 24 and 28. In this way pump up and pump down current generators 66 and 68 within charge pump circuit 32 are mutually actuated for the duration of the calibration interval. Hence, the charge pump 32 will deliver a net current of zero to node 36 during the calibration interval if the operational parameters of the oppositely-directed current generators 66 and 68 are identical. Discrepancies in, for example, the magnitudes of the pump up and pump down currents or turn-on time between the current generators 66 and 68 will result in a nonzero calibration mode current being sourced or sunk by a calibration network 72. The calibration network 72 then adjusts the magnitude of current output by pump down generator 68 in proportion to the charge accumulated thereby during the calibration cycle. In this way the calibration network 72 compensates for magnitude or rise time differences between the generators 66 and 68, thus preventing steady-state phase alignment errors from developing between the reference and recovered signals.

Again referring to FIG. 2, the VCO circuit 56 preferably includes a voltage-controlled crystal oscillator 80 and a programmable divide by N module 84. The value of the coefficient N will generally be selected based on the manner in which the reference signal is encoded, and on whether a recovered clock signal or a recovered data signal is to be launched on the feedback line 16. The control voltage supplied to the VCO circuit 56 at node 52 will typically comprise a direct current waveform from which energy at the frequency of the reference signal has been removed by the filter 48. The filter 48 may thus be implemented with a conventional RC filter network having a stop band which emcompasses the reference frequency of interest (e.g. 20 MHz).

As shown in FIG. 2, the calibration network 72 includes an operational amplifier 90 having a non-inverting terminal connected to the control node 52. The inverting terminal of the operational amplifier 90 is coupled to the second switch 62 and to an integrating capacitor 92. As noted above, the second switch 62 is closed during each calibration cycle. Hence, during each ensuing phase correction cycle the voltage across the capacitor 92 is indicative of the net charge delivered to, or supplied by, the charge pump circuit 32 during the preceding calibration cycle. The output of the op-amp 90 is coupled to capacitor 92 and is also coupled to the control terminal (not shown) of the pump down generator 68, and hence serves to adjust the current provided by the pump down generator 68 during each phase correction cycle. In this way the calibration network 72 ensures that the operational characteristics of the current generators 66 and 68 are in agreement prior the start of each phase correction cycle.

Figure 1:
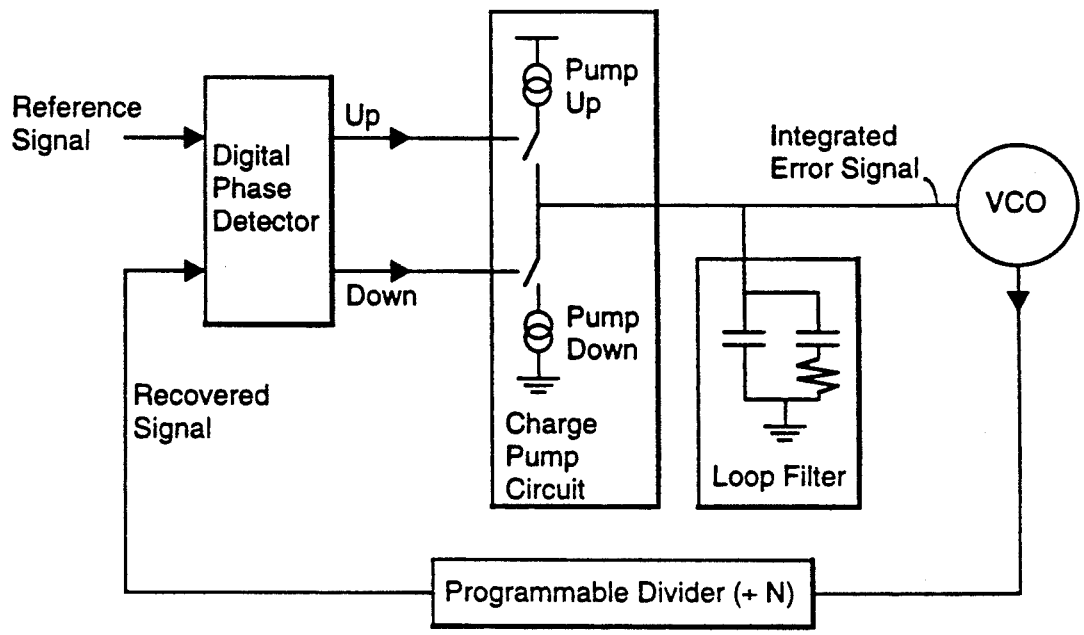
FIG. 1 is a block diagram of a prior art digital phase-locked loop.
Figure 3:
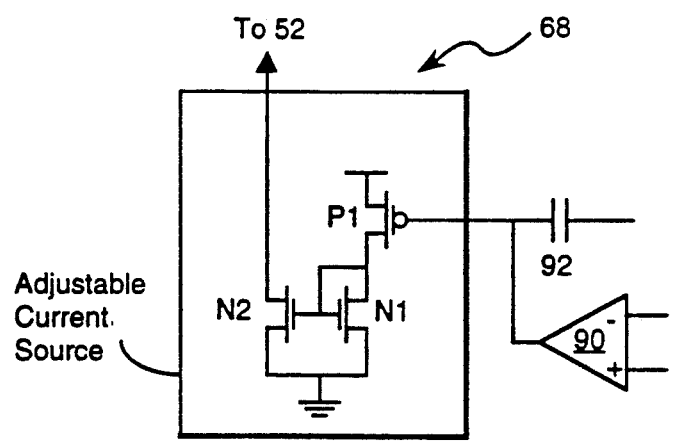
FIG. 3 shows an adjustable pump down current generator suitable for use within a charge pump circuit included within the inventive phase-locked loop.

FIG. 3 shows an adjustable pump down current generator 68 suitable for use in the charge pump circuit 32. The generator 68 includes both a p-channel transistor P1 and current mirroring n-channel transistors N1 and N2. As is indicated in FIG. 3, the gate of p-channel transistor P1 is driven by the op-amp 90. A phase detector suitable for use in the PLL 10 of FIG. 2 is shown in U.S. Pat. No. 4,814,726, which is hereby incorporated by reference.

The triggering network 40 may be implemented using a simple state machine having a one-shot circuit for driving the switches 44 and 62. As noted above, the signal combinations necessary to precipitate a calibration cycle recur at the conclusion of each phase correction cycle. The network 40 will thus preferably incorporate a simple logical network operative to prevent feedback line 58 from independently instigating successive calibration cycles in the absence of an intervening phase correction cycle.

Figure 4:
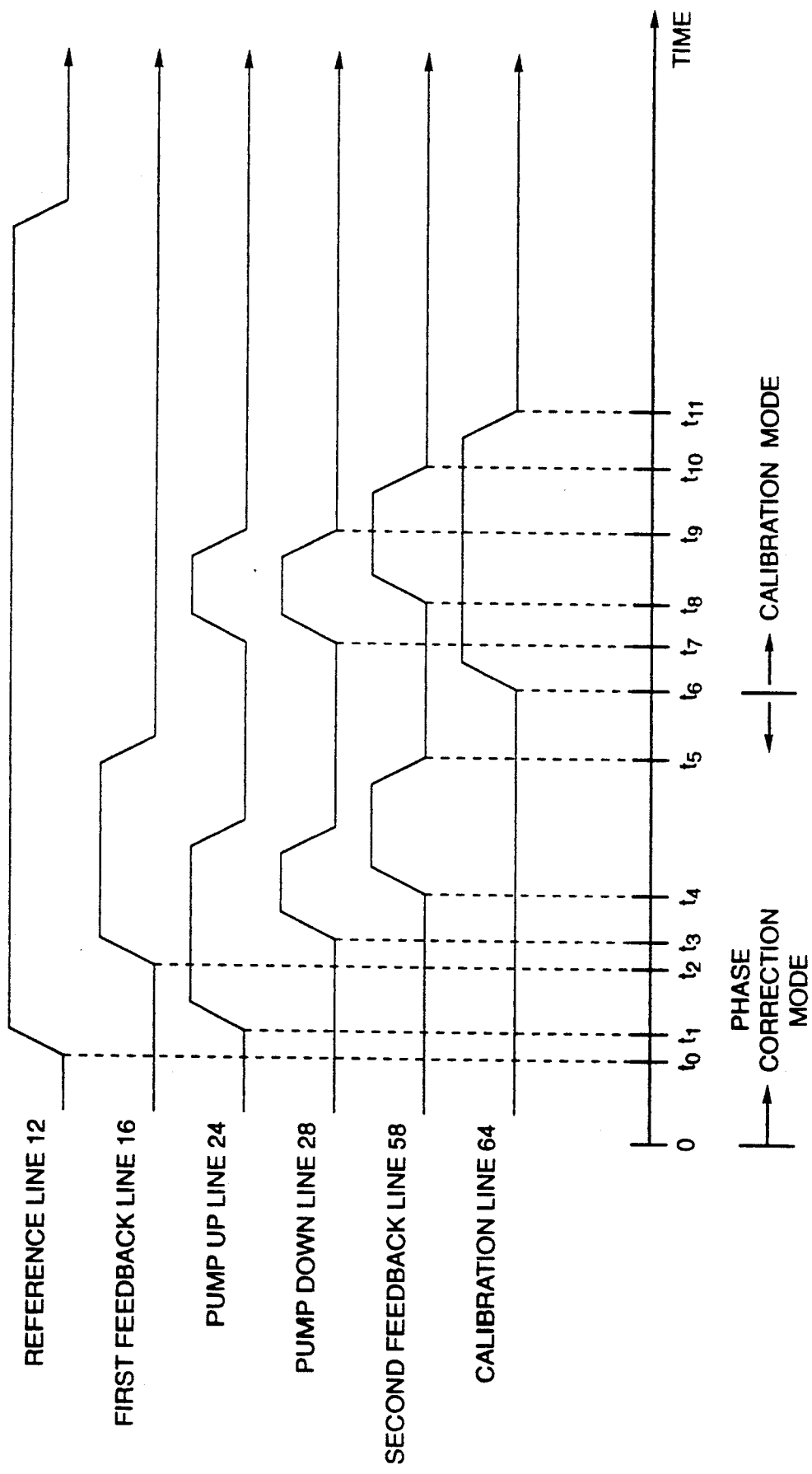
FIG. 4 is a timing diagram in which are depicted phase correction and phase calibration operating modes of the phase-locked loop of the present invention.

The operation of the present invention may be more fully appreciated by referring to the timing diagram depicted in FIG. 4. In the example illustrated by FIG. 4 the inventive PLL 10 is initially operative in the phase correction mode at a time $t_0$. At a time $t_2$ the phase detector 20 will sense a leading phase differential of $t_2 - t_0$ between the reference signal impressed on the input terminal 12 and the recovered signal present on the feedback line 16. Accordingly, the phase detector 20 raises pump up line 24 at a time $t_1$ and pump down line 28 at a later time $t_3$ in order to modify the control voltage supplied to the VCO circuit 56. By time $t_4$ both pump lines 24 and 28 have reached a logical high, thus inducing a positive transition on the second feedback line 58. The subsequent negative transition on the second feedback line 58 at time $t_5$ induces the network 40 to initiate a calibration cycle by raising calibration line 64 at a time $t_6$.

The high logical state of calibration line 64 simulates a phase-locked condition by inducing the OR gates 17 and 18 to simultaneously raise the inputs to the phase detector 20. The phase detector 20 then continues the calibration cycle by pulsing pump up and pump down lines 24 and 28 over the interval $t_7$ to $t_9$. Again, AND gate 60 causes a positive transition at time $t_8$ on the second feedback line 58 upon the raising of pump lines 24 and 28. The calibration cycle is concluded upon the calibration line 64 returning to a logical low at a time $t_{11}$ subsequent to the occurrence of a negative transition on the second feedback line 58 at time $t_{10}$.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, the inventive PLL could be easily modified so that calibration cycles are performed once every N clock cycles, instead of every clock cycle, particularly in relatively high frequency (i.e. >20 MHz) applications. The calibration cycle could replace a regular phase correction cycle in some alternate embodiments of the present invention. Furthermore, the PLL could be readily altered (e.g. by changing the triggering network 40 to output staggered signals to OR gates 17 and 18) to balance the charge pump circuit when a predefined phase relationship exists between the reference and recovered signals, such as a lag or lead phase of X nanoseconds.

What is claimed is:

1. A phase-locked loop having automatic internal phase offset calibration comprising:
    a voltage-controlled oscillator circuit that generates a recovered data signal in response to an error signal;
    phase detector means for generating a pulsed error signal indicative of phase difference between a reference data signal and said recovered data signal, said phase detector means having a charge pump circuit including first and second interconnected charge pump generators for combining first and second sets of pump signals to generate said error signal; and
    calibration means for equalizing a predefined characteristic of said first and second sets of pump signals;
    whereby said first and second sets of pump signals are precisely balanced when said reference data signal and said recovered data signal have a predefined phase relationship.

2. The phase-locked loop of claim 1,
    wherein said predefined signal characteristic equalized by said calibration means comprises current magnitude of said first and second sets of pump signals.

3. The phase-locked loop of claim 2 wherein said calibration means includes:
    a triggering circuit for inducing said first and second charge pump generators to respectively generate first and second calibration pulses during a calibration cycle, and
    an op-amp network for detecting the magnitude difference, if any, between said first and second calibration pulses and for adjusting said second charge pump generator in response thereto.

4. The phase-locked loop of claim 3 wherein said op-amp network includes:
    an operational amplifier having first and second input terminals and an output terminal, and
    a capacitor connected between said first input terminal and said output terminal, said capacitor being disposed to integrate and store a charge proportional to magnitude differences between said first and second calibration pulses.

5. The phase-locked loop of claim 4 wherein said triggering circuit further includes:
    a first switch operatively connected between said first input terminal of said operational amplifier and an output terminal of said charge pump circuit, said first switch being closed during said calibration cycle, and
    a second switch operatively connected between said output terminal of said charge pump circuit and an input terminal of said voltage-controlled oscillator, said second switch being open during said calibration cycle.

6. A phase-locked loop having automatic internal phase offset calibration comprising:
    a voltage-controlled oscillator circuit for generating a recovered data signal in response to an error signal;
    a phase detector for determining phase difference between a reference data signal and said recovered data signal;
    a charge pump circuit, coupled to said phase detector, for generating an error signal in response to said phase difference, said charge pump circuit including first and second pump generators for respectively providing first and second sets of pump signals, wherein said first and second charge pump generators are interconnected so as to generate said error signal; and
    calibration means for adjusting said second charge pump generator such that said first and second sets of pump signals are precisely balanced when said reference data signal and said recovered data signal have a predefined phase relationship.

7. The phase-locked loop of claim 6,
    wherein said predefined phase relationship is that of said reference and recovered data signals being matched in phase.

8. The phase-locked loop of claim 7 wherein said calibration means includes:
    a triggering circuit for inducing said first and second charge pump generators to respectively provide first and second calibration pulses during a calibration cycle, and
    an op-amp network for detecting the magnitude difference, if any, between said first and second calibration pulses and for adjusting said second charge pump generator in response thereto.

9. The phase-locked loop of claim 8 wherein said op-amp network includes:
    an operational amplifier having first and second input terminals and an output terminal, and
    a capacitor connected between said first input terminal and said output terminal, said capacitor being disposed to integrate and store a charge proportional to magnitude differences between said first and second calibration pulses.

10. The phase-locked loop of claim 9 wherein said triggering circuit further includes:
    a first switch operatively connected between said first input terminal of said operational amplifier and an output terminal of said charge pump circuit, said first switch being closed during said calibration cycle, and
    a second switch operatively connected between said output terminal of said charge pump circuit and an input terminal of said voltage-controlled oscillator, said second switch being open during said calibration cycle.

11. A phase-locked loop having automatic internal phase offset calibration comprising:
    a voltage-controlled oscillator circuit for generating a recovered data signal in response to a VCO control voltage;
    a phase detector for determining phase difference between a reference data signal and said recovered data signal;
    a charge pump circuit, coupled to said phase detector, for synthesizing an error current in response to said phase difference, said charge pump circuit including pump up and pump down current generators for providing pump up and pump down currents, wherein said pump up and pump down currents generators are interconnected so as to generate said error current;

a loop filter, coupled to said charge pump circuit, for generating said VCO control voltage from said error current;

calibration means for adjusting said pump down generator such that said pump up and pump down currents are precisely balanced when said reference data signal and said recovered data signal have a predefined phase relationship.

12. A phase-locked loop method of generating a recovered data signal, the steps of the method comprising:

generating said recovered data signal with a frequency governed by an error signal;

comparing phases of a reference data signal and said recovered data signal, including generating first and second sets of pump signals indicative of phase difference, if any, between said reference data signal and said recovered data signal, and combining said first and second sets of pump signals to generate said error signal; and periodically equalizing a predefined characteristic of said first and second sets of pump signals so that said first and second sets of pump signals are precisely balanced when said reference data signal and said recovered data signal have a predefined phase relationship.

13. The phase-locked loop method of claim 12, wherein said periodically equalized predefined signal characteristic comprises current magnitude of said first and second sets of pump signals.

* * * * *